US012658880B2

(12) United States Patent
Nakazawa

(10) Patent No.: US 12,658,880 B2
(45) Date of Patent: Jun. 16, 2026

(54) ACOUSTIC WAVE DEVICE

(71) Applicant: Murata Manufacturing Co., Ltd.,
Nagaokakyo (JP)

(72) Inventor: Hidetaro Nakazawa, Nagaokakyo (JP)

(73) Assignee: **MURATA MANUFACTURING CO.,
LTD.**, Kyoto (JP)

( * ) Notice: Subject to any disclaimer, the term of this
patent is extended or adjusted under 35
U.S.C. 154(b) by 161 days.

(21) Appl. No.: 18/653,240

(22) Filed: May 2, 2024

(65) Prior Publication Data

US 2025/0080079 A1      Mar. 6, 2025

(30) Foreign Application Priority Data

Aug. 30, 2023     (JP) .................................. 2023-140123

(51) Int. Cl.
| | |
|---|---|
| *H03H 9/02* | (2006.01) |
| *H03H 9/145* | (2006.01) |
| *H03H 9/25* | (2006.01) |
| *H03H 9/72* | (2006.01) |

(52) U.S. Cl.
CPC .... *H03H 9/02889* (2013.01); *H03H 9/02637*
(2013.01); *H03H 9/02866* (2013.01); *H03H
9/1452* (2013.01); *H03H 9/25* (2013.01);
*H03H 9/725* (2013.01)

(58) Field of Classification Search
CPC ........... H03H 9/02889; H03H 9/02637; H03H
9/02866; H03H 9/1452; H03H 9/25;
H03H 9/725
See application file for complete search history.

(56) References Cited

U.S. PATENT DOCUMENTS

| | | | |
|---|---|---|---|
| 2018/0287586 A1* | 10/2018 | Daimon ................... | H03H 9/25 |
| 2019/0149128 A1 | 5/2019 | Saji et al. | |
| 2021/0126616 A1* | 4/2021 | Hiramatsu ......... | H03H 9/14541 |
| 2022/0224311 A1 | 7/2022 | Daimon | |
| 2022/0271734 A1* | 8/2022 | Abbott ................ | H03H 9/1457 |
| 2023/0119788 A1* | 4/2023 | Goto ................... | H03H 9/02637 |
| | | | 310/313 R |

FOREIGN PATENT DOCUMENTS

| | | |
|---|---|---|
| JP | 2019-092095 A | 6/2019 |
| WO | 2021/065684 A1 | 4/2021 |

* cited by examiner

*Primary Examiner* — Samuel S Outten
(74) *Attorney, Agent, or Firm* — Keating & Bennett, LLP

(57) ABSTRACT

An acoustic wave device includes first and second acoustic
wave resonators with first and second IDT electrodes on a
common piezoelectric substrate. A first apodization area in
the first IDT electrode includes first and second edge areas
with a first center area therebetween. A second apodization
area in the second IDT electrode includes third and fourth
edge areas with a second center area therebetween. At least
one first mass-adding film is located in at least one of the first
and second edge areas and overlaps the electrode fingers of
the first IDT electrode, and at least one second mass-adding
film is located in at least one of the third and fourth edge
areas and overlaps the electrode fingers of the second IDT
electrode. A thickness of the at least one first mass-adding
film is equal to a thickness of the at least one second
mass-adding film.

20 Claims, 6 Drawing Sheets

ACOUSTIC WAVE DEVICE

CROSS REFERENCE TO RELATED APPLICATIONS

This application claims the benefit of priority to Japanese Patent Application No. 2023-140123 filed on Aug. 30, 2023. The entire contents of this application are hereby incorporated herein by reference.

BACKGROUND OF THE INVENTION

1. Field of the Invention

The present invention relates to acoustic wave devices each including multiple acoustic wave resonators.

2. Description of the Related Art

Acoustic wave devices have been widely used as, for example, filters in mobile phones. Japanese Unexamined Patent Application Publication No. 2019-092095 discloses an example of an acoustic wave device. This acoustic wave device includes an interdigital transducer (IDT) electrode on a piezoelectric substrate. The IDT electrode includes a center area and a pair of low acoustic velocity areas. The pair of low acoustic velocity areas hold the center area therebetween in a direction in which electrode fingers of the IDT electrode extend. In each low acoustic velocity area, a mass-adding film is located. The above structure reduces spurious frequencies in a transverse mode.

An acoustic wave device described in International Publication No. 2021/065684 includes an IDT electrode on a piezoelectric layer. The IDT electrode includes a center area and a pair of edge areas. The pair of edge areas hold the center area therebetween in a direction in which electrode fingers of the IDT electrode extend. The width of each electrode finger in the edge areas is greater than the width of each electrode finger in the center area. The above structure reduces spurious frequencies in a transverse mode.

SUMMARY OF THE INVENTION

However, when the acoustic wave device includes multiple acoustic wave resonators, these acoustic wave resonators often have different resonant frequencies. In this case, each acoustic wave resonator is to be adjusted to reduce the transverse mode. Thus, the productivity of the acoustic wave device may be reduced.

Accordingly, example embodiments of the present invention provide acoustic wave devices each capable of reliably reducing a transverse mode without reducing productivity.

An acoustic wave device according to an example embodiment of the present invention includes a first acoustic wave resonator including a piezoelectric substrate, and a first IDT electrode including a plurality of electrode fingers located on the piezoelectric substrate, and a second acoustic wave resonator sharing the piezoelectric substrate with the first acoustic wave resonator and including a second IDT electrode including a plurality of electrode fingers located on the piezoelectric substrate, in which an area in the first IDT electrode where adjacent ones of the plurality of electrode fingers overlap each other when viewed in a direction perpendicular to a direction in which the plurality of electrode fingers extend is a first apodization area, the first apodization area includes a first center area, and a first edge area and a second edge area with the first center area therebetween in the direction in which the plurality of electrode fingers extend, an area in the second IDT electrode where adjacent ones of the plurality of electrode fingers overlap each other when viewed in a direction perpendicular to the direction in which the plurality of electrode fingers extend is a second apodization area, the second apodization area includes a second center area, and a third edge area and a fourth edge area with the second center area therebetween in the direction in which the plurality of electrode fingers extend, the acoustic wave device further includes at least one first mass-adding film located in at least one of the first edge area and the second edge area, and overlapping the plurality of electrode fingers of the first IDT electrode in a plan view, and at least one second mass-adding film located in at least one of the third edge area and the fourth edge area, and overlapping the plurality of electrode fingers of the second IDT electrode in a plan view, in which a thickness of the plurality of electrode fingers of the second IDT electrode is smaller than a thickness of the plurality of electrode fingers of the first IDT electrode, a thickness of the at least one first mass-adding film is equal to a thickness of the at least one second mass-adding film, and a width of the plurality of electrode fingers of the second IDT electrode at a portion overlapping the at least one second mass-adding film in a plan view is smaller than a width of the plurality of electrode fingers of the second IDT electrode in the second center area.

Example embodiments of the present invention provide acoustic wave devices each capable of more reliably reducing a transverse mode without reducing productivity.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

With reference to the drawings, specific example embodiments of the present invention are described below to clarify the present invention.

Each example embodiment described herein is a mere example. Components between different example embodiments may be partially replaced with each other or combined with each other.

Figure 1:
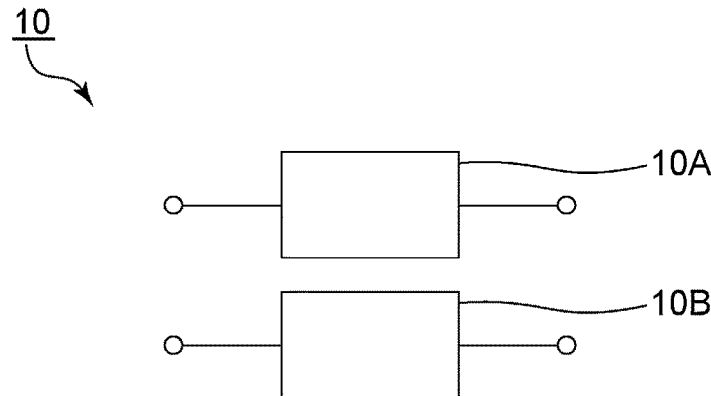
FIG. 1 is a schematic diagram of an acoustic wave device according to a first example embodiment of the present invention.
Figure 2:
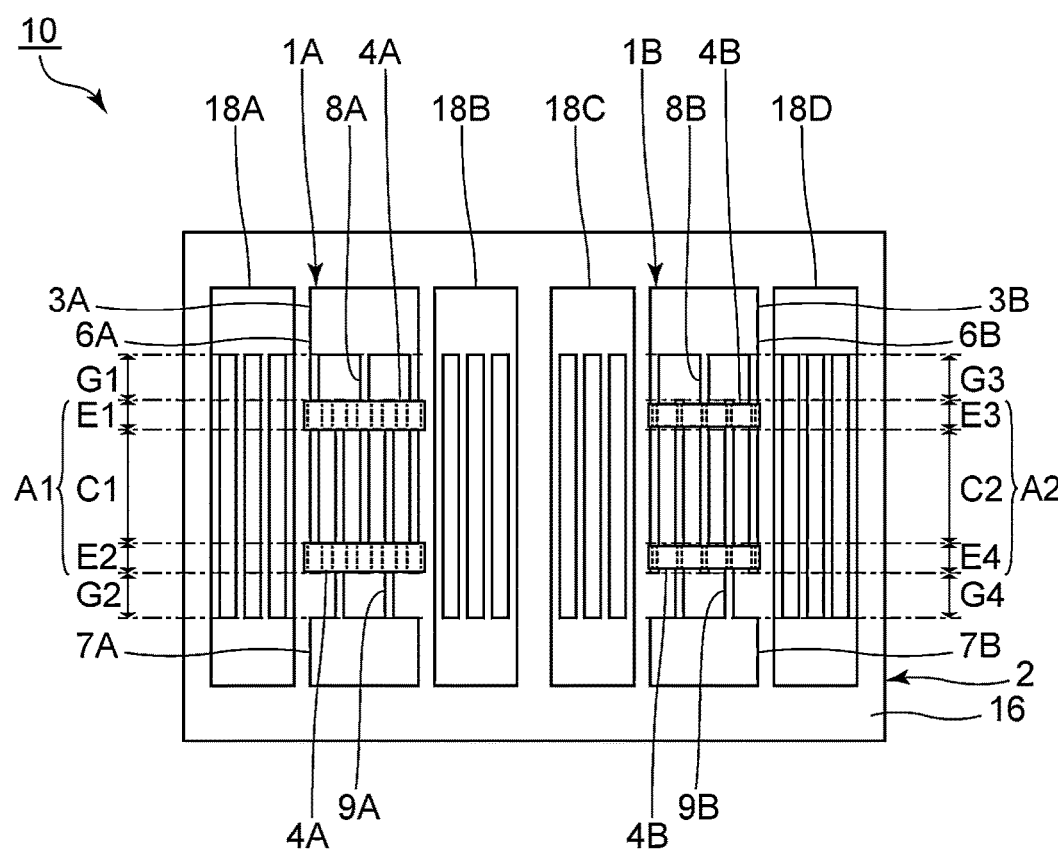
FIG. 2 is a schematic plan view of a first acoustic wave resonator and a second acoustic wave resonator according to the first example embodiment of the present invention.

FIG. 1 is a schematic diagram of an acoustic wave device according to a first example embodiment of the present invention. FIG. 2 is a schematic plan view of a first acoustic wave resonator and a second acoustic wave resonator according to the first example embodiment. FIG. 2 omits a dielectric film described below.

An acoustic wave device 10 illustrated in FIG. 1 is a composite filter device. The acoustic wave device 10 includes a first filter device 10A and a second filter device 10B. More specifically, the first filter device 10A and the second filter device 10B are band-pass filters. The first filter device 10A and the second filter device 10B may each be a transmission filter or a reception filter. In the present example embodiment, the first filter device 10A and the second filter device 10B are connected to different signal potentials.

Instead, the acoustic wave device 10 may be a multiplexer such as a duplexer. In this case, for example, an input potential or an output potential of the first filter device 10A and an input potential or an output potential of the second filter device 10B may be connected in common to the same signal-potential terminal.

The pass band of the first filter device 10A and the pass band of the second filter device 10B are different from each other. More specifically, the pass band of the second filter device 10B is located higher than the pass band of the first filter device 10A. The first filter device 10A may be used as, for example, a band-pass filter for a middle band. The second filter device 10B may be used as, for example, a band-pass filter for a high band.

The first filter device 10A includes a first acoustic wave resonator 1A illustrated in FIG. 2. The second filter device 10B includes a second acoustic wave resonator 1B illustrated in FIG. 2. The resonant frequency of the second acoustic wave resonator 1B is higher than the resonant frequency of the first acoustic wave resonator 1A. FIG. 2 illustrates the first acoustic wave resonator 1A and the second acoustic wave resonator 1B schematically arranged. However, the arrangement of the first acoustic wave resonator 1A and the second acoustic wave resonator 1B is not limited to a particular one.

The first acoustic wave resonator 1A and the second acoustic wave resonator 1B share a piezoelectric substrate 2. The piezoelectric substrate 2 is a substrate with piezoelectricity. In the present example embodiment, the piezoelectric substrate 2 is a multilayer substrate including a piezoelectric layer 16. The piezoelectric substrate 2 may be a substrate formed simply from a piezoelectric material.

The first acoustic wave resonator 1A includes a first IDT electrode 3A. The first IDT electrode 3A is located on the piezoelectric substrate 2. Unless otherwise noted, located on the piezoelectric substrate 2 indicates located on the piezoelectric layer 16 in the following description.

The first IDT electrode 3A includes a pair of bus bars and multiple electrode fingers. More specifically, the pair of bus bars include a first bus bar 6A and a second bus bar 7A. The first bus bar 6A and the second bus bar 7A face each other. More specifically, the multiple electrode fingers include multiple first electrode fingers 8A and multiple second electrode fingers 9A. First ends of the multiple first electrode fingers 8A are connected to the first bus bar 6A. First ends of the multiple second electrode fingers 9A are connected to the second bus bar 7A. The first electrode fingers 8A and the second electrode fingers 9A are connected to different potentials. The multiple first electrode fingers 8A and the multiple second electrode fingers 9A interdigitate with one another.

The second acoustic wave resonator 1B includes a second IDT electrode 3B. The second IDT electrode 3B is located on the piezoelectric substrate 2. The second IDT electrode 3B includes a pair of bus bars and multiple electrode fingers. More specifically, the pair of bus bars include a third bus bar 6B and a fourth bus bar 7B. The third bus bar 6B and the fourth bus bar 7B face each other. More specifically, the multiple electrode fingers include multiple third electrode fingers 8B and multiple fourth electrode fingers 9B. First ends of the multiple third electrode fingers 8B are connected to the third bus bar 6B. First ends of the multiple fourth electrode fingers 9B are connected to the fourth bus bar 7B. The multiple third electrode fingers 8B and the multiple fourth electrode fingers 9B interdigitate with one another.

Figure 3:
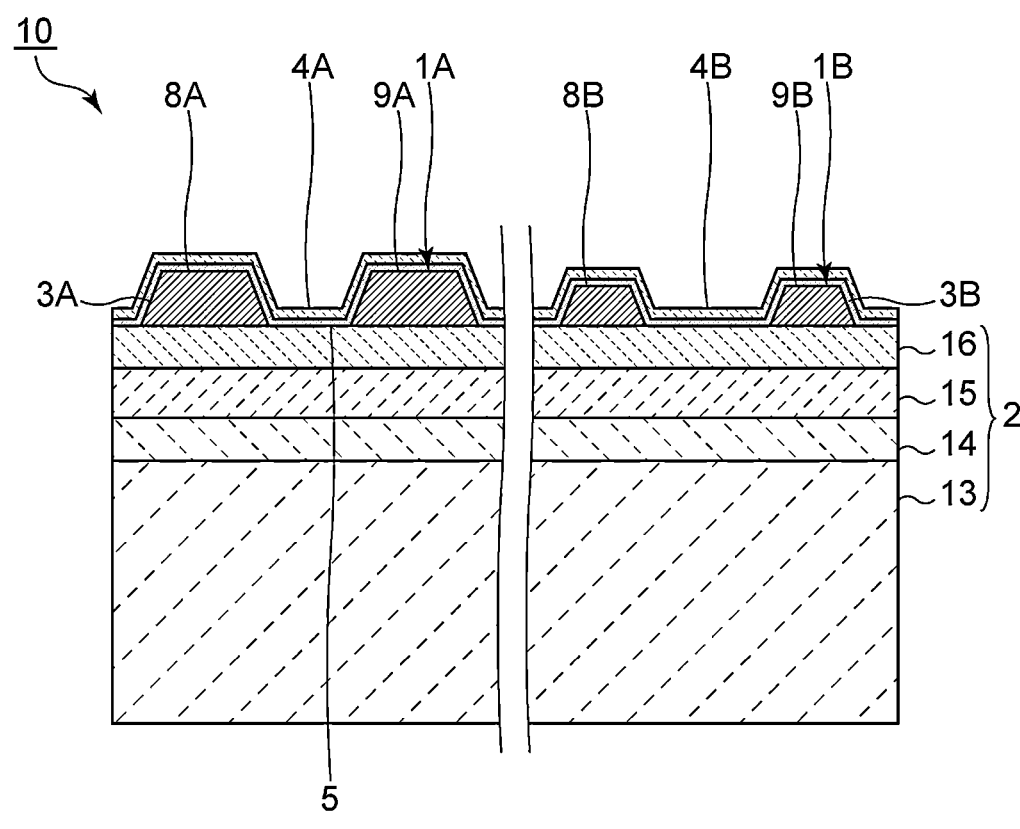
FIG. 3 is a schematic front cross-sectional view around a pair of electrode fingers of the first acoustic wave resonator and a pair of electrode fingers of the second acoustic wave resonator according to the first example embodiment of the present invention.

FIG. 3 is a schematic front cross-sectional view around a pair of electrode fingers of a first acoustic wave resonator and a pair of electrode fingers of a second acoustic wave resonator according to the first example embodiment. FIG. 3 is a schematic front cross-sectional view of a first edge area and a third edge area described below.

The thickness of the multiple electrode fingers of the second IDT electrode 3B is smaller than the thickness of the multiple electrode fingers of the first IDT electrode 3A. Thus, the resonant frequency of the second acoustic wave resonator 1B can be easily raised. In contrast, the resonant frequency of the first acoustic wave resonator 1A can be easily lowered.

Referring back to FIG. 2, the direction in which the multiple first electrode fingers 8A and the multiple second electrode fingers 9A extend is defined as an electrode-finger extension direction of the first IDT electrode 3A, and a direction perpendicular to the electrode-finger extension direction is defined as a perpendicular-to-electrode-finger direction of the first IDT electrode 3A. A direction in which the multiple third electrode fingers 8B and the multiple fourth electrode fingers 9B extend is defined as an electrode-finger extension direction of the second IDT electrode 3B, and a direction perpendicular to the electrode-finger extension direction is defined as a perpendicular-to-electrode-finger direction of the second IDT electrode 3B. In the present example embodiment, in the first acoustic wave resonator 1A and the second acoustic wave resonator 1B, the electrode-finger extension directions are parallel to each other, and the perpendicular-to-electrode-finger directions are parallel to each other.

When an alternating current voltage is applied to the first IDT electrode 3A, acoustic waves are generated. A pair of reflectors 18A and 18B are located on the piezoelectric substrate 2 on both sides of the first IDT electrode 3A in an acoustic-wave propagation direction. The first acoustic wave resonator 1A is a surface acoustic wave resonator. The acoustic-wave propagation direction of the first IDT electrode 3A is parallel to the perpendicular-to-electrode-finger direction.

When an alternating current voltage is applied to the second IDT electrode 3B, acoustic waves are generated. A pair of reflectors 18C and 18D are located on the piezoelectric substrate 2 on both sides of the second IDT electrode 3B in an acoustic-wave propagation direction. The second acoustic wave resonator 1B is a surface acoustic wave resonator. The acoustic-wave propagation direction of the second IDT electrode 3B is parallel to the perpendicular-to-electrode-finger direction.

In the present example embodiment, the first IDT electrode 3A, the second IDT electrode 3B, and each reflector include multilayer metal films. More specifically, in each of these, a Ti layer, an Al layer, and a Ti layer are laminated in this order from the piezoelectric substrate 2. The materials of the first IDT electrode 3A, the second IDT electrode 3B, and each reflector are not limited to the above examples. Alternatively, the first IDT electrode 3A, the second IDT electrode 3B, and each reflector may each be a single-layer metal film.

When viewed in the perpendicular-to-electrode-finger direction, areas in the first IDT electrode 3A where the first electrode fingers 8A and the second electrode fingers 9A adjacent to each other overlap each other are first apodization areas A1. The first apodization area A1 includes a first center area C1 and a pair of edge areas. More specifically, the pair of edge areas include a first edge area E1 and a second edge area E2. The first edge area E1 and the second edge area E2 hold the first center area C1 therebetween in the electrode-finger extension direction and face each other. The first edge area E1 is located closer to the first bus bar 6A. The second edge area E2 is located closer to the second bus bar 7A.

When viewed in the perpendicular-to-electrode-finger direction, areas in the second IDT electrode 3B where the third electrode fingers 8B and the fourth electrode fingers 9B adjacent to each other overlap each other are second apodization areas A2. The second apodization area A2 includes a second center area C2 and a pair of edge areas. More specifically, the pair of edge areas include a third edge area E3 and a fourth edge area E4. The third edge area E3 and the fourth edge area E4 hold the second center area C2 therebetween in the electrode-finger extension direction to oppose each other. The third edge area E3 is located closer to the third bus bar 6B. The fourth edge area E4 is located closer to the fourth bus bar 7B.

A pair of first mass-adding films 4A are located in the pair of edge areas of the first acoustic wave resonator 1A. More specifically, one first mass-adding film 4A of the pair of first mass-adding films 4A is located in the first edge area E1. The other first mass-adding film 4A of the pair of first mass-adding films 4A is located in the second edge area E2.

The pair of first mass-adding films 4A have a belt shape. More specifically, in a plan view, one first mass-adding film 4A overlaps the multiple first electrode fingers 8A and multiple second electrode fingers 9A. More specifically, one first mass-adding film 4A is located over the piezoelectric substrate 2, the multiple first electrode fingers 8A, and the multiple second electrode fingers 9A. The first mass-adding film 4A is continuously located to overlap, in a plan view, with the multiple electrode fingers of the first IDT electrode 3A and areas between the electrode fingers.

Herein, a plan view refers to a view of the acoustic wave device viewed in a direction corresponding to the above in FIG. 3. In FIG. 3, for example, the first mass-adding film 4A is located above among the piezoelectric substrate 2 and the first mass-adding film 4A.

As illustrated in FIG. 2, the width of the electrode fingers of the first IDT electrode 3A at portions overlapping the first mass-adding films 4A in a plan view is greater than the width of the electrode fingers of the first IDT electrode 3A in the first center area C1. Instead, the width of the electrode fingers of the first IDT electrode 3A may be uniform. The width of the electrode fingers is a dimension of the electrode fingers in the perpendicular-to-electrode-finger direction.

In the first acoustic wave resonator 1A, the first mass-adding films 4A located in the first edge area E1 define low acoustic velocity areas in the first edge area E1. The low acoustic velocity areas in the first acoustic wave resonator 1A are areas with a lower acoustic velocity than the first center area C1. Similarly, the first mass-adding films 4A located in the second edge area E2 define low acoustic velocity areas in the second edge area E2. In the present example embodiment, an increase of the width of the electrode fingers in the pair of edge areas also lowers the acoustic velocity in the pair of edge areas.

A pair of second mass-adding films 4B are located in the pair of edge areas of the second acoustic wave resonator 1B. One second mass-adding film 4B of the pair of second mass-adding film 4B is located in the third edge area E3. The other second mass-adding film 4B of the pair of the pair of second mass-adding films 4B is located in the fourth edge area E4.

The pair of second mass-adding films 4B have a belt shape. More specifically, in a plan view, one second mass-adding film 4B overlaps the multiple third electrode fingers 8B and the multiple fourth electrode fingers 9B. More specifically, one second mass-adding film 4B is located over the piezoelectric substrate 2, the multiple third electrode fingers 8B, and the multiple fourth electrode fingers 9B. The second mass-adding film 4B is continuously located to overlap, in a plan view, with the multiple electrode fingers of the second IDT electrode 3B and areas between the electrode fingers.

In the second acoustic wave resonator 1B, the second mass-adding films 4B located in the third edge area E3 form low acoustic velocity areas in the third edge area E3. The low acoustic velocity areas in the second acoustic wave resonator 1B are areas with a lower acoustic velocity than the second center area C2. Similarly, the second mass-adding film 4B located in the fourth edge area E4 defines a low acoustic velocity area in the fourth edge area E4.

In the first acoustic wave resonator 1A, the first center area C1 and the pair of low acoustic velocity areas are arranged in this order from the center to the outer sides in the electrode-finger extension direction. In the second acoustic wave resonator 1B, the second center area C2 and the pair of low acoustic velocity areas are arranged in this order from the center to the outer sides in the electrode-finger extension direction. Thus, a piston mode is established in each of the first acoustic wave resonator 1A and the second acoustic wave resonator 1B, and the transverse mode can thus be reduced.

As a material of the first mass-adding films 4A and the second mass-adding films 4B, a tantalum oxide such as Ta 05 may be used, for example. The material of the first mass-adding films 4A and the second mass-adding films 4B is not limited to the above. Hereinbelow, the first mass-adding films 4A and the second mass-adding films 4B may be collectively and simply described as mass-adding films.

As illustrated in FIG. 3, a dielectric film 5 is located on the piezoelectric substrate 2 to cover the first IDT electrode 3A, the second IDT electrode 3B, the first mass-adding films 4A, and the second mass-adding films 4B. Thus, a laminate body of the first IDT electrode 3A and the dielectric film 5 and a laminate body of the second IDT electrode 3B and the dielectric film 5 are provided.

The dielectric film 5 protects the first IDT electrode 3A and the second IDT electrode 3B. Thus, the first IDT electrode 3A and the second IDT electrode 3B are less easily broken. In the present example embodiment, a silicon oxide is used as a material of the dielectric film 5. The material of the dielectric film 5 is not limited to the above. The dielectric film 5 may be eliminated.

Figure 4:
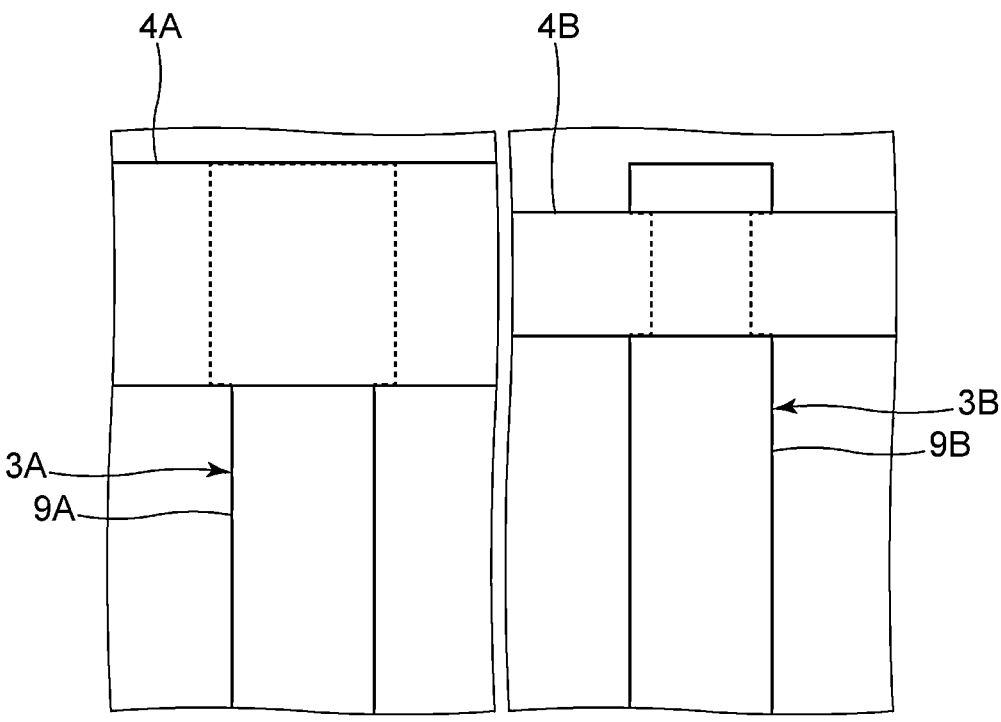
FIG. 4 is an enlarged schematic plan view around one electrode finger of a first IDT electrode and one electrode finger of a second IDT electrode according to the first example embodiment of the present invention.

The present example embodiment has the following unique structural features: 1) the thickness of the multiple electrode fingers of the second IDT electrode 3B is smaller than the thickness of the multiple electrode fingers of the first IDT electrode 3A; 2) the thickness of the first mass-adding films 4A is equal to the thickness of the second mass-adding films 4B; and 3) as illustrated in FIG. 4 in an enlarged manner, the width of the electrode fingers of the second IDT electrode 3B at portions overlapping the second mass-adding films 4B in a plan view is smaller than the width of the electrode fingers of the second IDT electrode 3B in the second center area C2. Thus, the present example embodiment can more reliably reduce the transverse mode without lowering the productivity. This point is described below.

First, example conditions with which the transverse mode can be more reliably reduced are described. The conditions indicate that a width-to-wavelength ratio W and a thickness ratio $T_R$ described below fall within predetermined ranges. The wavelength defined by an electrode finger pitch is denoted with A. The electrode finger pitch is a distance in the perpendicular-to-electrode-finger direction between the centers of the adjacent electrode fingers connected to different potentials. The dimension of the mass-adding films in the electrode-finger extension direction divided by the wavelength A is defined as the width-to-wavelength ratio W.

The product of the density and the thickness of each layer of the electrode finger divided by the density of Al is defined as an Al equivalent thickness of the layer. The total of the Al equivalent thickness of the layers of each electrode finger is defined as the Al equivalent thickness of the electrode finger. For example, n is any natural number, k is a natural number where $1 \leq k \leq n$, and each electrode finger includes n layers. When the density of a k-th electrode-finger layer from the piezoelectric substrate 2 is defined as $\rho_w$, the thickness of the k-th electrode-finger layer is defined as $t_k$, the Al equivalent thickness of the k-th electrode-finger layer is defined as $T_k$, and the Al density of the k-th electrode-finger layer is defined as $\rho_{al}$, the Al equivalent thickness $T_k$ of each layer of the electrode finger is $T_k=\{(\rho_k \cdot \rho_{Al})/\rho_{Al}\}$. $\rho_{Al}$ is 2.694 g/cm$^3$. When the Al equivalent thickness of the electrode finger is $T_{IDT}$, the Al equivalent thickness $T_{IDT}$ is $T_{IDT}=\varepsilon\{(\rho_k \cdot T_k+)/(\rho_{Al})\}$ ($1 \leq k \leq n$).

The product of the density and the thickness of the dielectric film 5 divided by the density of Al is defined as an Al equivalent thickness of the dielectric film 5. When the density of the dielectric film 5 is defined as pa, the thickness of the dielectric film 5 is defined as ta, and the Al equivalent thickness of the dielectric film 5 is defined as Ta, the Al equivalent thickness Ta of the dielectric film 5 is $T_a=\{(\rho_d \cdot t_d/\rho_{Al}\}$. The Al equivalent thickness of the laminate body of the dielectric film 5 and the electrode finger is defined as $T_T$.

The thickness of the mass-adding films is defined as $t_m$, and the thickness ratio of the thickness $t_m$ of the mass-adding films to the Al equivalent thickness $T_T$ of the laminate body of the dielectric film 5 and the electrode fingers is defined as $T_R$ [%]. The thickness ratio $T_R$ is $T_R=(t_m/T_T) \times 100$ [%].

The transverse mode includes various modes such as first to 11-th modes. When the relationship between the width-to-wavelength ratio W and the thickness ratio $T_R$ and the ranges of the width-to-wavelength ratio W and the thickness ratio $T_R$ are as illustrated in FIG. 5, the size of the largest one of ripples attributable to the transverse mode in the frequency characteristics can be reduced to equal to or smaller than about 1 dB, for example.

Figure 5:
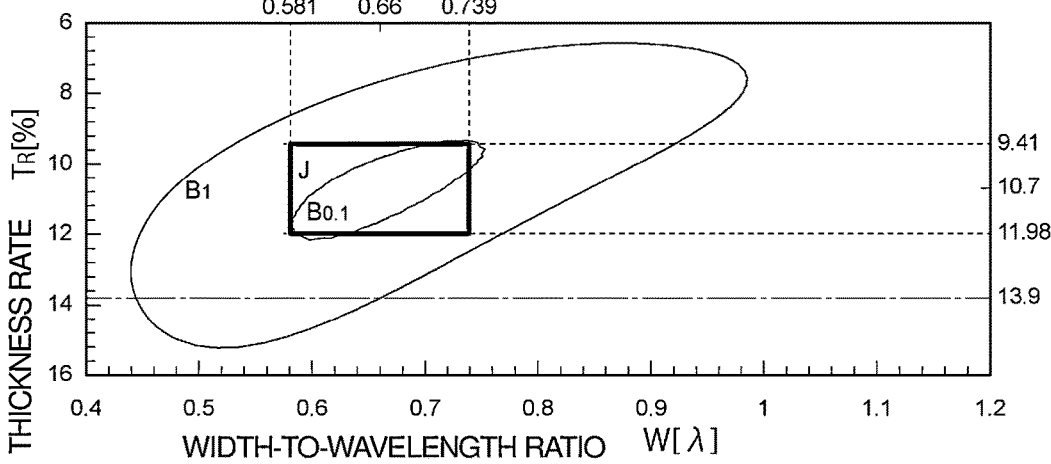
FIG. 5 is a graph showing the relationship between a thickness ratio $T_R$ and a width-to-wavelength ratio W of a mass-adding film when a ripple attributable to a transverse mode has a size of about 1 dB or about 0.1 dB, for example.

FIG. 5 illustrates the relationship between the width-to-wavelength ratio W of the mass-adding films and the thickness ratio $T_R$ where the ripple attributable to the transverse mode has a size of about 1 dB or about 0.1 dB, for example.

FIG. 5 illustrates, with a solid line $B_I$, a combination of the width-to-wavelength ratio W and the thickness ratio $T_R$ where the ripple attributable to the transverse mode in the frequency characteristics of the acoustic wave resonator has a size of about 1 dB, for example. For a combination of the width-to-wavelength ratio W and the thickness ratio $T_R$ within a range surrounded by the solid line $B_I$, the ripple attributable to the transverse mode has a size of equal to or smaller than about 1 dB, for example.

FIG. 5 illustrates a range J. This range J is located within a range surrounded by the solid line $B_I$. More specifically, an approximately ±12% range with respect to the combination of the width-to-wavelength ratio W and the thickness ratio $T_R$ at which the transverse mode is most effectively reduced is a range J. When the width-to-wavelength ratio W and the thickness ratio $T_R$ fall within this range J, the size of the ripple attributable to the transverse mode can be more reliably reduced to equal to or smaller than about 1 dB, for example.

In FIG. 5, a solid line $B_{0.1}$ indicates a combination of the width-to-wavelength ratio W and the thickness ratio $T_R$ where the ripple attributable to the transverse mode has a size of about 0.1 dB, for example. When the width-to-wavelength ratio W and the thickness ratio $T_R$ fall within range surrounded by the solid line $B_{0.1}$, the size of the ripple attributable to the transverse mode can be reduced to smaller than or equal to about 0.1 dB, for example.

When the thickness ratio $T_R$ is about 10.7% in the first acoustic wave resonator 1A, as illustrated in FIG. 5, the width-to-wavelength ratio W and the thickness ratio $T_R$ fall within the range J when the width-to-wavelength ratio W of the first mass-adding films 4A is greater than or equal to about 0.581λ and smaller than or equal to about 0.739λ, for example. In this case, the first acoustic wave resonator 1A can more reliably reduce the transverse mode.

In contrast, the thickness of the electrode fingers of the second IDT electrode 3B of the second acoustic wave resonator 1B is smaller than the thickness of the electrode fingers of the first IDT electrode 3A of the first acoustic wave resonator 1A. Thus, the resonant frequency of the second acoustic wave resonator 1B can be easily raised. The thickness ratio $T_R$ of the second acoustic wave resonator 1B is not about 10.7%. This example is illustrated in Table 1.

TABLE 1

|  | First Acoustic Wave Resonator | Second Acoustic Wave Resonator |
|---|---|---|
| Al Equivalent Thickness $T_T$ of Laminate Body of Dielectric Film and Electrode Fingers | 175.8 nm | 135.8 nm |
| Thickness $t_m$ of Mass-adding films | 18.8 nm | 18.8 nm |
| Thickness Ratio $T_R$ $((t_m/T_T) \times 100)$ | 10.7% | 13.9% |

In the example in Table 1, the Al equivalent thickness of the laminate body of the dielectric film 5 and the electrode fingers of the second acoustic wave resonator 1B is smaller than the Al equivalent thickness of the laminate body of the dielectric film 5 and the electrode fingers of the first acoustic wave resonator 1A. In contrast, the mass-adding films in the first acoustic wave resonator 1A and the second acoustic wave resonator 1B have the same thickness. Thus, the thickness ratio $T_R$ in the second acoustic wave resonator 1B is greater than that in the first acoustic wave resonator 1A. More specifically, in the example in Table 1, the thickness ratio $T_R$ in the second acoustic wave resonator 1B is about 13.9%, which is indicated with a dot-and-dash line in FIG. 5.

In the example in Table 1, the thickness ratio $T_R$ in the first acoustic wave resonator 1A is about 10.7%, for example. As illustrated in FIG. 5, in the first acoustic wave resonator 1A, the range of the width-to-wavelength ratio W of the first mass-adding films 4A where the transverse mode can be reduced is wide. In contrast, the thickness ratio $T_R$ in the second acoustic wave resonator 1B is about 13.9%, for example. Also in this case, when the width-to-wavelength ratio W of the second mass-adding films 4B falls within the range of the width-to-wavelength ratio W illustrated in FIG. 5 where the transverse mode can be reduced, the transverse mode can be reduced. In this case, the transverse mode can also be reduced in the first reference example illustrated in FIG. 6 and the second reference example illustrated in FIG. 7.

Figure 6:
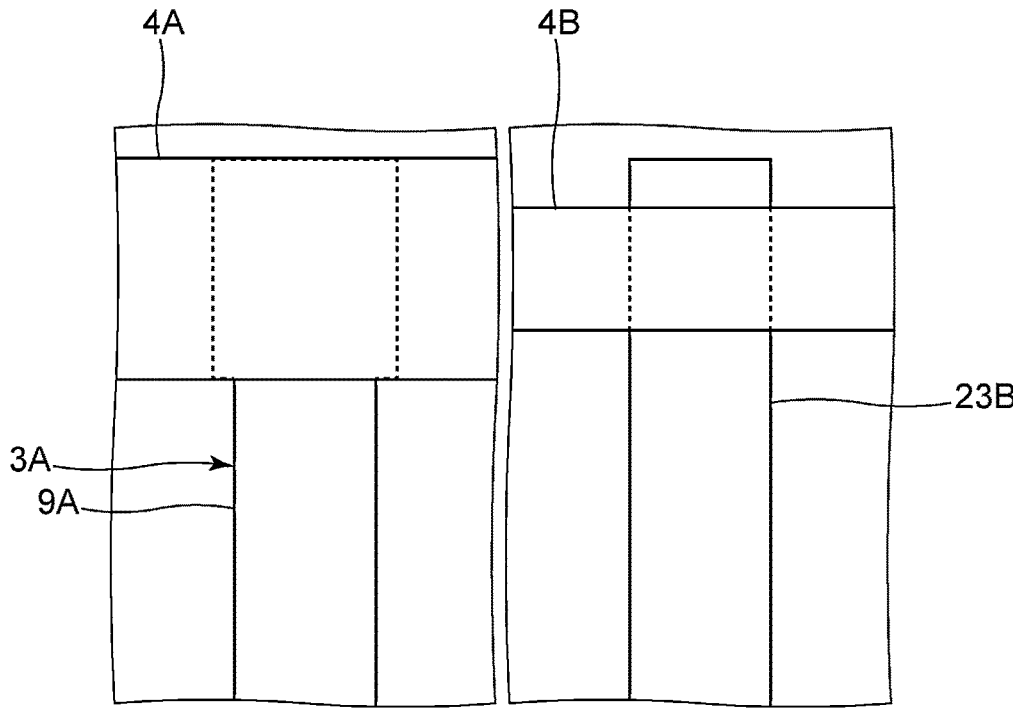
FIG. 6 is an enlarged schematic plan view around one electrode finger of a first IDT electrode and one electrode finger of a second IDT electrode in a first reference example.
Figure 7:
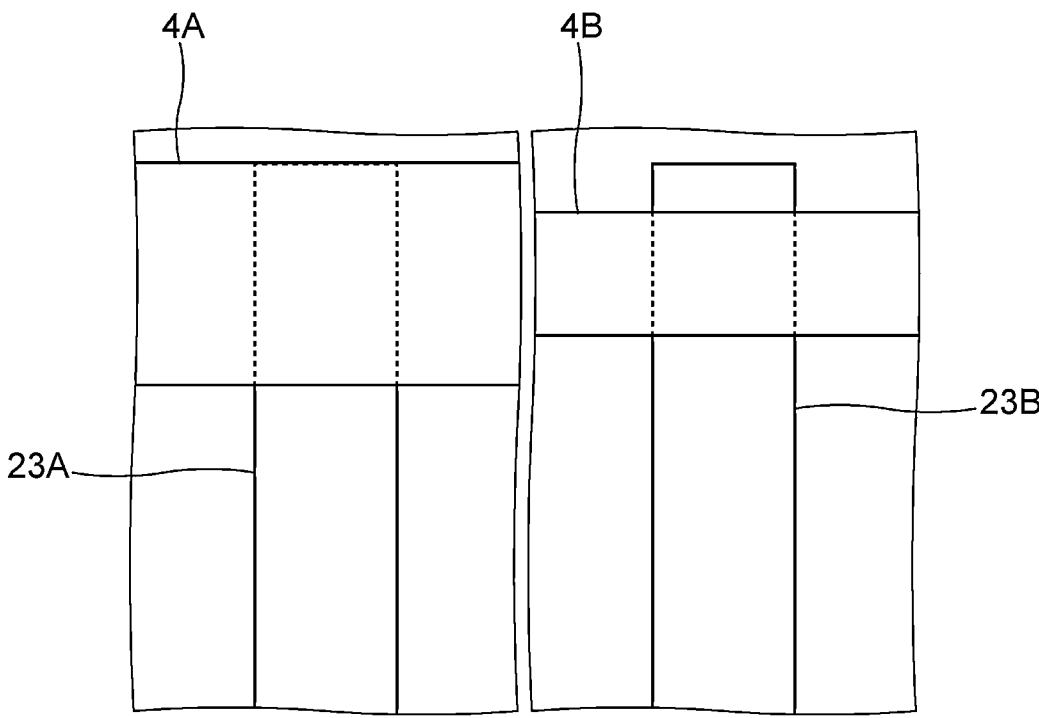
FIG. 7 is an enlarged schematic plan view around one electrode finger of the first IDT electrode and one electrode finger of the second IDT electrode in a second reference example.

More specifically, in the first reference example illustrated in FIG. 6, the electrode finger of a second IDT electrode 23B has a uniform width. In contrast, the first IDT electrode 3A has the same structure as in the first example embodiment. In the second reference example illustrated in FIG. 7, the electrode finger of a first IDT electrode 23A and the electrode finger of the second IDT electrode 23B have a uniform width. Also in these cases, the width-to-wavelength ratio W of the second mass-adding film 4B may fall within the range of the width-to-wavelength ratio W illustrated in FIG. 5 where the transverse mode can be reduced. However, the range of the width-to-wavelength ratio W of the second mass-adding film 4B where the transverse mode can be reduced is narrow.

The thickness ratio $T_R$ can be reduced by reducing the thickness of the second mass-adding films 4B further than the thickness of the first mass-adding films 4A. Thus, the thickness ratio $T_R$ can be approximated to the values within the range J also in the second acoustic wave resonator 1B. However, in this case, the manufacturing process is to include a process of differentiating the thickness of the first mass-adding films 4A from the thickness of the second mass-adding films 4B.

Thus, the present inventor has discovered that when the width of the electrode fingers of the second IDT electrode 3B at portions overlapping the second mass-adding films 4B in a plan view is smaller than the width of the electrode fingers of the second IDT electrode 3B in the second center area C2, the range of the width-to-wavelength ratio W where the transverse mode can be reduced is widened. More specifically, the transverse mode can be reduced regardless of when the width-to-wavelength ratio W of the second mass-adding films 4B is outside the range illustrated in FIG. 5 where the transverse mode can be reduced. More specifically, the transverse mode can be reduced regardless of when the width-to-wavelength ratio W of the second mass-adding films 4B is further reduced.

As described above, in the acoustic wave device 10 according to the present example embodiment, the thickness of the first mass-adding film 4A is equal to the thickness of the second mass-adding film 4B. In addition, the width of the electrode fingers of the second IDT electrode 3B at portions overlapping the second mass-adding films 4B in a plan view is smaller than the width of the electrode fingers of the second IDT electrode 3B in the second center area C2. Thus, the range of the width-to-wavelength ratio W in the second mass-adding films 4B where the transverse mode can be reduced can be widened without complicating the manufacturing process. Thus, the acoustic wave device 10 according to the present example embodiment can more reliably reduce the transverse mode without lowering the productivity.

As in the present example embodiment, the width of the electrode fingers of the first IDT electrode 3A at portions overlapping the first mass-adding films 4A in a plan view is preferably greater than the width of the electrode fingers of the first IDT electrode 3A in the first center area C1.

More specifically, for example, to further lower the resonant frequency of the first acoustic wave resonator 1A, the thickness of the electrode fingers of the first IDT electrode 3A may further be increased. In this case, the range of the width-to-wavelength ratio W of the first mass-adding films 4A where the transverse mode can be reduced may be reduced. In contrast, in the present example embodiment, the width of the electrode fingers of the first IDT electrode 3A at portions overlapping the first mass-adding films 4A in a plan view is greater than the width of the electrode fingers of the first IDT electrode 3A in the first center area C1. Thus, the range of the width-to-wavelength ratio W where transverse mode can be reduced can be widened in the first acoustic wave resonator 1A. More specifically, the transverse mode can be effectively reduced regardless of when the width-to-wavelength ratio W of the first mass-adding films 4A is further increased.

As in the second acoustic wave resonator 1B, the thickness ratio $T_R$ is increased when the thickness of the electrode fingers of the second IDT electrode 3B is reduced to raise the resonant frequency. As illustrated in FIG. 5, when the thickness ratio $T_R$ is high, the range of the width-to-wavelength ratio W of the mass-adding films where the transverse mode can be reduced is smaller than when the thickness ratio $T_R$ is small. In contrast, in the first example embodiment of the present invention, the range of the width-to-wavelength ratio W of the second mass-adding films 4B where the transverse mode can be reduced can be increased in the second acoustic wave resonator 1B. Thus, the structure of the present invention is preferable as a structure that reduces the transverse mode without lowering the productivity.

The structure of the first example embodiment is further described in detail below. As illustrated in FIG. 2, a pair of gap areas are located between the first apodization area A1 of the first acoustic wave resonator 1A and a pair of bus bars. More specifically, the pair of gap areas include a first gap area G1 and a second gap area G2. The first gap area G1 is located closer to the first bus bar 6A. The second gap area G2 is located closer to the second bus bar 7A.

Among the multiple first electrode fingers 8A and the multiple second electrode fingers 9A, the multiple first electrode fingers 8A are simply located in the first gap area G1. Thus, the first gap area G1 defines a high acoustic velocity area. The high acoustic velocity area in the first acoustic wave resonator 1A is an area with a higher acoustic velocity than the first center area C1. Similarly, the second gap area G2 defines a high acoustic velocity area.

The second acoustic wave resonator 1B includes a third gap area G3 and a fourth gap area G4, defining and functioning as a pair of gap areas. The third gap area G3 is located closer to the third bus bar 6B. The fourth gap area G4 is located closer to the fourth bus bar 7B. In the second acoustic wave resonator 1B, each of the third gap area G3 and the fourth gap area G4 defines a high acoustic velocity area. The high acoustic velocity areas in the second acoustic wave resonator 1B are areas with a higher acoustic velocity than the second center area C2.

In the first acoustic wave resonator 1A, the first center area C1, the pair of low acoustic velocity areas, and the pair of high acoustic velocity areas are arranged in this order from the inside to the outer sides in the electrode-finger extension direction. Thus, the first acoustic wave resonator 1A can more reliably reduce the transverse mode. In the second acoustic wave resonator 1B, the second center area C2, the pair of low acoustic velocity areas, and the pair of high acoustic velocity areas are arranged in this order from the inside to the outer sides in the electrode-finger extension direction. Thus, the second acoustic wave resonator 1B can more reliably reduce the transverse mode.

In the first acoustic wave resonator 1A according to the first example embodiment, each first mass-adding film 4A is located in the corresponding edge area. Each first mass-adding film 4A may be located in at least one of the first edge area E1 and the second edge area E2. Preferably, the first mass-adding films 4A are located in both of the first edge area E1 and the second edge area E2. This structure can more reliably and effectively reduce the transverse mode.

Similarly, in the second acoustic wave resonator 1B, each second mass-adding film 4B may be located in at least one of the third edge area E3 and the fourth edge area E4. Preferably, the second mass-adding films 4B are located in both of the third edge area E3 and the fourth edge area E4. This structure can more reliably and effectively reduce the transverse mode.

As illustrated in FIG. 4, the distal end of each fourth electrode finger 9B of the second IDT electrode 3B does not overlap the corresponding second mass-adding film 4B in a plan view. The distance in the electrode-finger extension direction in a plan view between the distal end of each fourth electrode finger 9B and the edge portion of the second mass-adding film 4B located in the third edge area E3 and closer to the distal end of the fourth electrode finger 9B is preferably smaller than or equal to about 0.1λ, for example. Similarly, the distance in the electrode-finger extension direction in a plan view between the distal end of each third electrode finger 8B illustrated in FIG. 1 and the edge portion of the second mass-adding film 4B located in the fourth edge area E4 and closer to the distal end of the third electrode finger 8B is preferably smaller than or equal to about 0.1λ, for example. The distal end of the electrode finger of the second IDT electrode 3B may overlap the second mass-adding film 4B in a plan view.

In contrast, the distal end of each electrode finger of the first IDT electrode 3A overlaps the corresponding first mass-adding film 4A in a plan view. Instead, the distal end of each electrode finger of the first IDT electrode 3A does not have to overlap the corresponding first mass-adding film 4A in a plan view. In this case, preferably, the distance in the electrode-finger extension direction in a plan view between the distal end of each second electrode finger 9A and the edge portion of the first mass-adding film 4A located in the first edge area E1 and closer to the distal end of the second electrode finger 9A is equal to or smaller than about 0.1λ, for example. The distance in the electrode-finger extension direction in a plan view between the distal end of each first electrode finger 8A and the edge portion of the first mass-adding film 4A located in the second edge area E2 and closer to the distal end of the first electrode finger 8A is equal to or smaller than about 0.1λ, for example.

As illustrated in FIG. 3, in the first acoustic wave resonator 1A, each first mass-adding film 4A is located between the dielectric film 5 and the first electrode finger 8A and the second electrode finger 9A. Instead, for example, each first mass-adding film 4A, the electrode fingers, and the dielectric film 5 may be laminated in this order from the piezoelectric substrate 2. Alternatively, the electrode fingers, the dielectric film 5, and each first mass-adding film 4A may be laminated in this order from the piezoelectric substrate 2.

In the second acoustic wave resonator 1B, each second mass-adding film 4B is located between the dielectric film 5 and the third electrode finger 8B and the fourth electrode finger 9B. Instead, for example, each second mass-adding film 4B, the electrode fingers, and the dielectric film 5 may be laminated in this order from the piezoelectric substrate 2. Alternatively, the electrode fingers, the dielectric film 5, and each second mass-adding film 4B may be laminated in this order from the piezoelectric substrate 2.

The piezoelectric substrate 2 of the acoustic wave device 10 is a multilayer substrate. More specifically, the piezoelectric substrate 2 includes a support substrate 13, a high acoustic-velocity film 14, a low acoustic-velocity film 15, and a piezoelectric layer 16. The high acoustic-velocity film 14 is located on the support substrate 13. The low acoustic-velocity film 15 is located on the high acoustic-velocity film 14. The piezoelectric layer 16 is located on the low acoustic-velocity film 15.

In the first example embodiment, a lithium tantalate such as LiTaO₃ is used as the material of the piezoelectric layer 16. The material of the piezoelectric layer 16 is not limited to the above, and may be, for example, a lithium niobate, a zinc oxide, an aluminum nitride, a crystal, or a lead zirconate titanate (PZT).

The low acoustic-velocity film 15 is a film with a relatively low acoustic velocity. More specifically, the acoustic velocity of bulk waves that propagate through the low acoustic-velocity film 15 is lower than the acoustic velocity of bulk waves that propagate through the piezoelectric layer 16. As the material of the low acoustic-velocity film 15, for example, glass, a silicon oxide, a silicon oxynitride, a lithium oxide, a tantalum oxide, a dielectric such as a compound obtained by adding fluorine, carbon, or boron to a silicon oxide, or a material including any of these materials as a main component. Herein, the main component is a component whose content exceeds 50 wt %. The material of the main component may be in a single crystal, polycrystal, or amorphous state, or in the state where these are mixed.

The high acoustic-velocity film 14 is a film with a relatively high acoustic velocity. More specifically, bulk waves propagate through the high acoustic-velocity film 14 at a higher acoustic velocity than the acoustic waves that propagate through the piezoelectric layer 16. The material of the high acoustic-velocity film 14 may be, for example, a piezoelectric material such as an aluminum nitride, a lithium tantalate, a lithium niobate, or a crystal, a ceramic material such as alumina, sapphire, magnesia, a silicon nitride, a silicon carbide, zirconia, cordierite, mullite, steatite, forsterite, spinel, or sialon, a dielectric material such as an aluminum oxide, a silicon oxynitride, a diamondlike carbon (DLC), or diamond, a semiconductor such as silicon, or a material including any of the above materials as a main component. Spinel described above includes an aluminum compound including oxygen and one or more elements selected from, for example, Mg, Fe, Zn, and Mn. Examples of spinel include $MgAl_2O_4$, $FeAl_2O_4$, $ZnAl_2O_4$, and $MnAl_2O_4$.

The material of the support substrate 13 may be, for example, a piezoelectric material such as an aluminum nitride, a lithium tantalate, a lithium niobate, or a crystal, a ceramic material such as alumina, sapphire, magnesia, a silicon nitride, a silicon carbide, zirconia, cordierite, mullite, steatite, or forsterite, a dielectric material such as diamond or glass, a semiconductor such as silicon or a gallium nitride, a resin, or a material including any of the above materials as a main component.

In the piezoelectric substrate 2, the high acoustic-velocity film 14, the low acoustic-velocity film 15, and the piezoelectric layer 16 are laminated in this order. Thus, the energy of the acoustic waves can be effectively confined in the piezoelectric layer 16.

The multilayer structure of the piezoelectric substrate is not limited to the above. For example, the piezoelectric substrate may be a multilayer substrate of a support substrate, a high acoustic-velocity film, and a piezoelectric layer. Alternatively, the piezoelectric substrate includes a high-acoustic-velocity support substrate formed from the same materials as the high acoustic-velocity film. The acoustic velocity of bulk waves that propagate through the high-acoustic-velocity support substrate is higher than the acoustic velocity of acoustic waves that propagate through the piezoelectric layer. In this case, the piezoelectric substrate may be a multilayer substrate of a high-acoustic-velocity support substrate, a low acoustic-velocity film, and a piezoelectric layer, or a multilayer substrate of a high-acoustic-velocity support substrate and a piezoelectric layer. Also in these cases, the energy of the acoustic waves can be effectively confined in the piezoelectric layer.

Table 2 lists examples of metal materials and dielectric materials and the density of each material. Any of metals listed in Table 2 may be used as a material of the first IDT electrode 3A or the second IDT electrode 3B illustrated in FIG. 3. Any of dielectric materials listed in Table 2 may be used as a material of the dielectric film 5. Any of dielectric materials listed in Table 2 may be used as a material of the first mass-adding films 4A and the second mass-adding films 4B. The metal material used in the first IDT electrode 3A or the second IDT electrode 3B or the dielectric material used in the dielectric film 5, the first mass-adding films 4A, or the second mass-adding films 4B may include a small amount of different materials. For example, an Al layer may include a small amount of Cu.

TABLE 2

| | Density [g/cm³] |
|---|---|
| Al | 2.694 |

TABLE 2-continued

| | Density [g/cm³] |
|---|---|
| Ti | 4.54 |
| Cu | 8.93 |
| Ta | 16.67 |
| Au | 19.3 |
| Pt | 21.37 |
| Aluminum Oxide | 3.98 |
| Silicon Oxide | 2.21 |
| Germanium Oxide | 6.2 |
| Tantalum Oxide | 8.47 |

As described above, in the first example embodiment, the first acoustic wave resonator 1A and the second acoustic wave resonator 1B are surface acoustic wave resonators. The resonant frequencies of the surface acoustic wave resonators can be compared using the electrode finger pitch of the IDT electrode and the duty ratio. When the electrode fingers of the surface acoustic wave resonators have different thicknesses, the resonant frequency of one surface acoustic wave resonator where a reciprocal of the product of the electrode finger pitch, the duty ratio, and the thickness of the electrode fingers is greater is higher than the resonant frequency of the other surface acoustic wave resonator.

Preferably, a reciprocal of the product of the electrode finger pitch, the duty ratio, and the thickness of the electrode fingers of the second IDT electrode 3B in the second acoustic wave resonator 1B is greater than a reciprocal of the electrode finger pitch, the duty ratio, and the thickness of the electrode fingers of the first IDT electrode 3A of the first acoustic wave resonator 1A. In this case, the resonant frequency of the second acoustic wave resonator 1B is higher than the resonant frequency of the first acoustic wave resonator 1A. In the first example embodiment, the thickness of the multiple electrode fingers of the second IDT electrode 3B is smaller than the thickness of the multiple electrode fingers of the first IDT electrode 3A. Thus, the resonant frequency of the second acoustic wave resonator 1B can be appropriately raised further than the resonant frequency of the first acoustic wave resonator 1A.

Thus, the purposes of use of the first filter device 10A including the first acoustic wave resonator 1A and the second filter device 10B including the second acoustic wave resonator 1B can be separated as appropriate. For example, the first filter device 10A can be appropriately used as a band-pass filter for a middle band. For example, the second filter device 10B can be appropriately used as a band-pass filter for a high band.

Figure 8:
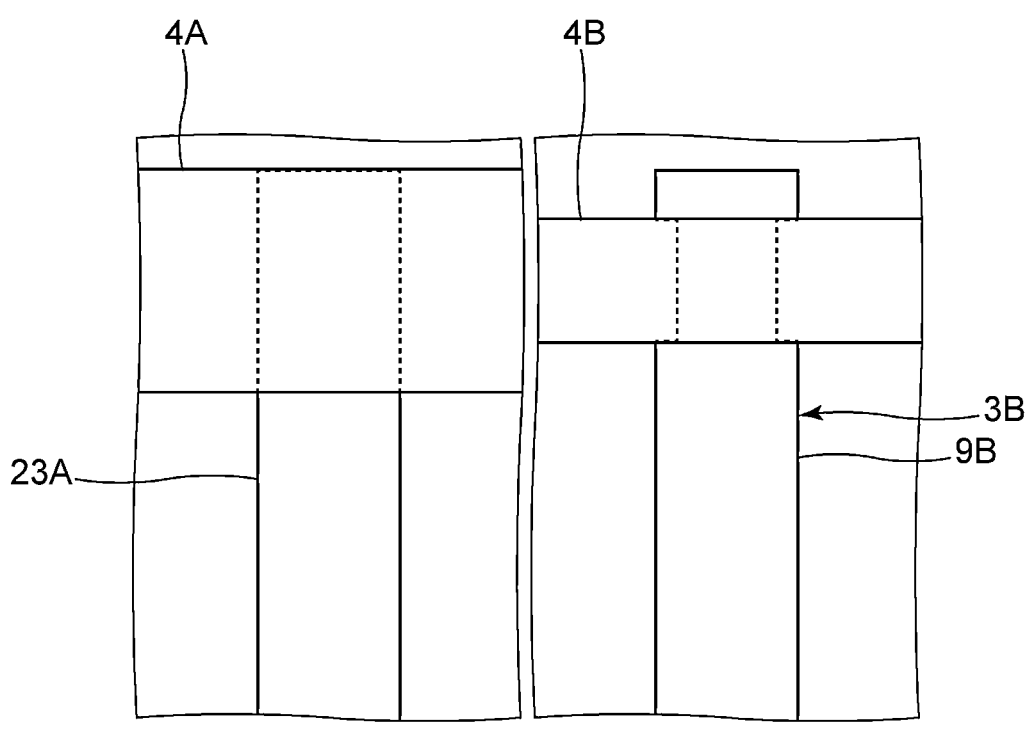
FIG. 8 is an enlarged schematic plan view around one electrode finger of the first IDT electrode and one electrode finger of the second IDT electrode in a modification example of the first example embodiment of the present invention.

The width of the electrode fingers of the first IDT electrode 3A at portions overlapping the first mass-adding films 4A in a plan view does not have to be greater than the width of the electrode fingers of the first IDT electrode 3A in the first center area C1. For example, in a modification example of the first example embodiment illustrated in FIG. 8, the electrode fingers of the first IDT electrode 23A have a uniform width. In this case, preferably, in the first acoustic wave resonator, the thickness ratio $T_R$ and the width-to-wavelength ratio W of the first mass-adding films 4A fall within, for example, the range J illustrated in FIG. 5. In contrast, the width of the electrode fingers of the second IDT electrode 3B at portions overlapping the second mass-adding films 4B in a plan view is smaller than the width of the electrode fingers of the second IDT electrode 3B in the second center area C2. Thus, as in the first example embodiment, the modification example can more reliably reduce the transverse mode without lowering the productivity.

Figure 9:
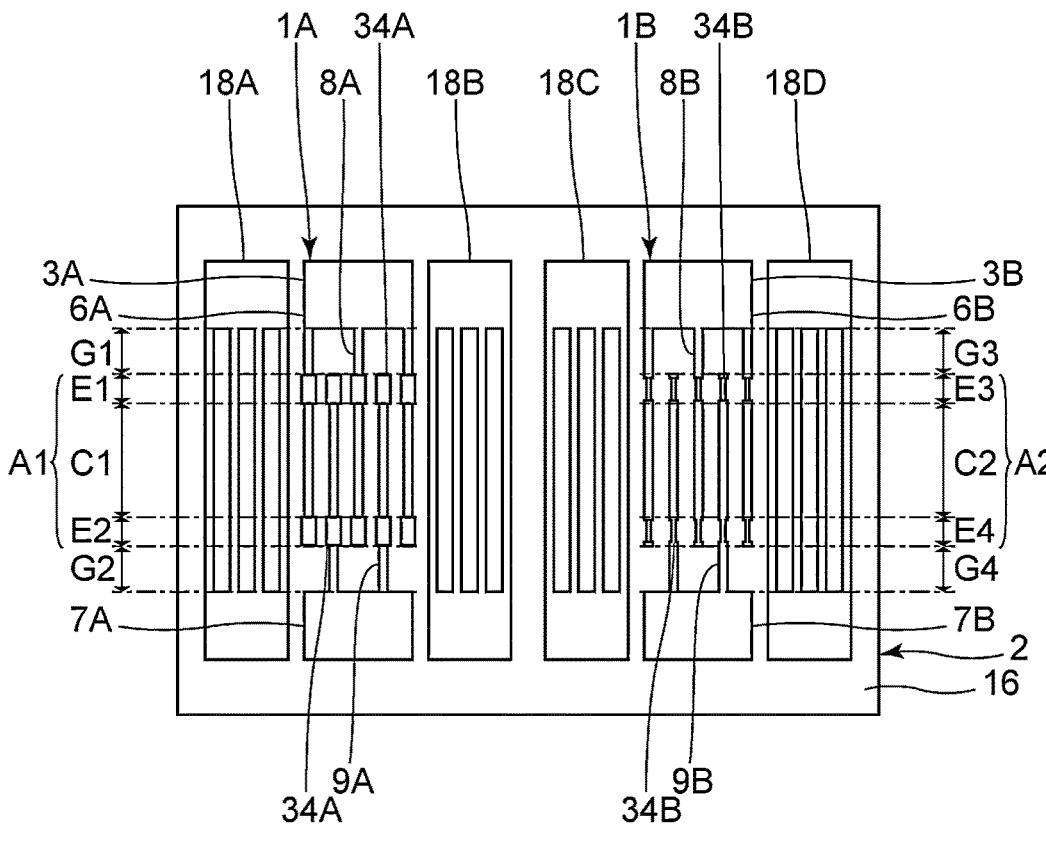
FIG. 9 is a schematic plan view of a first acoustic wave resonator and a second acoustic wave resonator according to a second example embodiment of the present invention.
Figure 10:
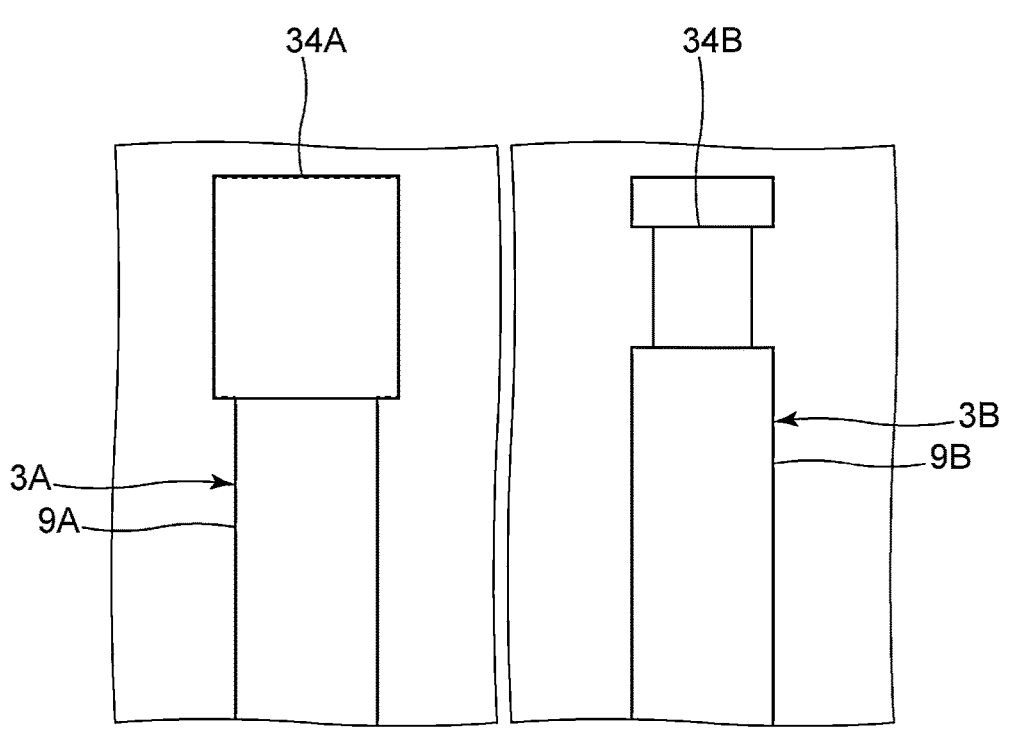
FIG. 10 is an enlarged schematic plan view around one electrode finger of a first IDT electrode and one electrode finger of a second IDT electrode according to the second example embodiment of the present invention.

FIG. 9 is a schematic plan view of a first acoustic wave resonator and a second acoustic wave resonator according to a second example embodiment. FIG. 10 is an enlarged schematic plan view around one electrode finger of a first IDT electrode and one electrode finger of a second IDT electrode according to the second example embodiment.

The present example embodiment differs from the first example embodiment in that it includes multiple mass-adding films in each edge area. Except for the above point, the acoustic wave device according to the present example embodiment has the same structure as the acoustic wave device 10 according to the first example embodiment.

Multiple first mass-adding films 34A are located in the first edge area E1 of the first acoustic wave resonator 1A. Multiple first mass-adding films 34A are also located in the second edge area E2. One first mass-adding film 34A overlaps one electrode finger in a plan view. In the present example embodiment, the first mass-adding films 34A are located simply at portions overlapping the electrode fingers in a plan view. Instead, each first mass-adding film 34A may extend from, in a plan view, a portion overlapping the electrode finger to a portion overlapping an area between the electrode fingers in a plan view.

Multiple second mass-adding films 34B are located in the third edge area E3 of the second acoustic wave resonator 1B. Multiple second mass-adding films 34B are also located in the fourth edge area E4. One second mass-adding film 34B overlaps one electrode finger in a plan view. In the present example embodiment, the second mass-adding films 34B are located simply at portions overlapping the electrode fingers in a plan view. Instead, each second mass-adding film 34B may extend from, in a plan view, a portion overlapping the electrode finger to a portion overlapping an area between the electrode fingers in a plan view.

Also in the present example embodiment, the width of the electrode fingers of the second IDT electrode 3B at portions overlapping the second mass-adding films 34B in a plan view is smaller than the width of the electrode fingers of the second IDT electrode 3B in the second center area C2. Thus, as in the first example embodiment, the present example embodiment can more reliably reduce the transverse mode without lowering the productivity.

Figure 11:
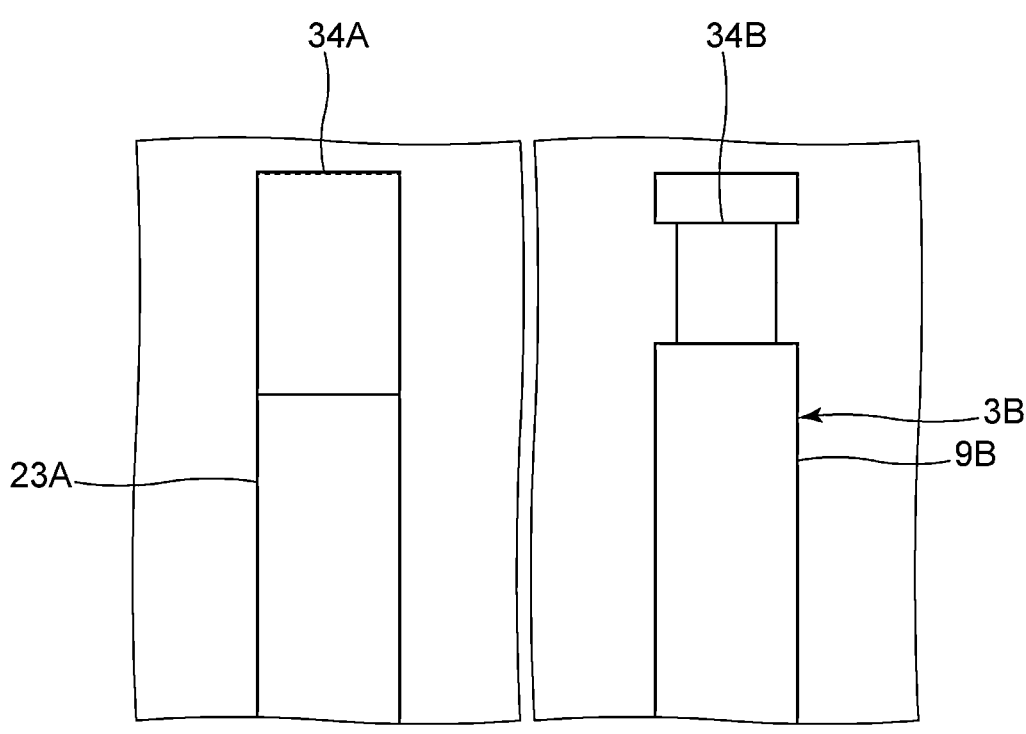
FIG. 11 is an enlarged schematic plan view around one electrode finger of a first IDT electrode and one electrode finger of a second IDT electrode according to a modification example of the second example embodiment of the present invention.

The width of the electrode fingers of the first IDT electrode 3A at portions overlapping the first mass-adding films 34A in a plan view does not have to be widened. For example, the width of the electrode fingers of the first IDT electrode 23A is uniform in the modification example of the second example embodiment illustrated in FIG. 11. In this case, in the first acoustic wave resonator, preferably, the thickness ratio $T_R$ and the width-to-wavelength ratio W of the first mass-adding films 34A fall within, for example, the range J illustrated in FIG. 5. In contrast, the width of the electrode fingers of the second IDT electrode 3B at portions overlapping the second mass-adding films 34B in a plan view is smaller than the width of the electrode fingers of the second IDT electrode 3B in the second center area C2. Thus, as in the second example embodiment, the present example embodiment can more reliably reduce the transverse mode without lowering the productivity.

The first mass-adding films 34A are not in contact with multiple electrode fingers connected to different potentials. Similarly, the second mass-adding films 34B are not in contact with multiple electrode fingers connected to different potentials. In this case, a metal may be used as the material of the first mass-adding films 34A or the second mass-adding films 34B. Instead, a dielectric may be used as the material of the first mass-adding films 34A or the second mass-adding films 34B.

Figure 12:
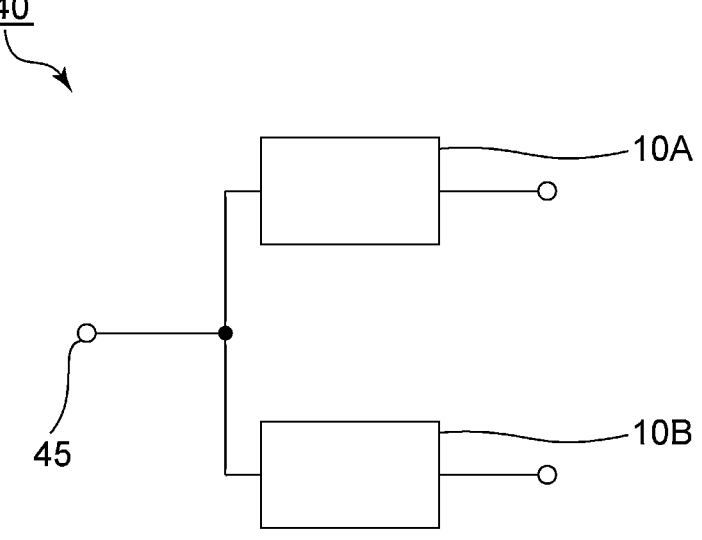
FIG. 12 is a schematic diagram of an acoustic wave device according to a third example embodiment of the present invention.

FIG. 12 is a schematic diagram of an acoustic wave device according to a third example embodiment.

An acoustic wave device 40 according to the present example embodiment is a multiplexer. The acoustic wave device 40 includes a common connection terminal 45, the first filter device 10A, and the second filter device 10B. The first filter device 10A and the second filter device 10B are connected in common to the common connection terminal 45. The common connection terminal 45 may be, for example, an electrode pad, or a wire.

The first filter device 10A and the second filter device 10B are the same as those according to the first example embodiment. More specifically, the first filter device 10A includes the first acoustic wave resonator 1A illustrated in FIG. 2. The second filter device 10B includes the second acoustic wave resonator 1B illustrated in FIG. 2. As in the first example embodiment, the present example embodiment can reduce the transverse mode without lowering the productivity.

The acoustic wave device 40 may include at least one filter device other than the first filter device 10A and the second filter device 10B. The filter device may be connected in common to the common connection terminal 45 together with the first filter device 10A and the second filter device 10B. The number of filter devices in the acoustic wave device 40 is not limited to a particular one.

In an example embodiment of the present invention, the first acoustic wave resonator 1A and the second acoustic wave resonator 1B may be included in one band-pass filter.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device, comprising:
   a first acoustic wave resonator including:
      a piezoelectric substrate; and
      a first IDT electrode including a plurality of electrode
        fingers located on the piezoelectric substrate; and
   a second acoustic wave resonator sharing the piezoelectric
      substrate with the first acoustic wave resonator and
      including:
      a second IDT electrode including a plurality of elec-
        trode fingers located on the piezoelectric substrate;
        wherein
   an area in the first IDT electrode where adjacent ones of
      the plurality of electrode fingers overlap each other
      when viewed in a direction perpendicular to a direction
      in which the plurality of electrode fingers extend is a
      first apodization area;
   the first apodization area includes a first center area, and
      a first edge area and a second edge area with the first
      center area therebetween in the direction in which the
      plurality of electrode fingers extend;
   an area in the second IDT electrode where adjacent ones
      of the plurality of electrode fingers overlap each other
      when viewed in a direction perpendicular to the direc-
      tion in which the plurality of electrode fingers extend is
      a second apodization area;
   the second apodization area includes a second center area,
      and a third edge area and a fourth edge area with the
      second center area therebetween in the direction in
      which the plurality of electrode fingers extend;

the acoustic wave device further comprises:

at least one first mass-adding film located in at least one of the first edge area and the second edge area, and overlapping the plurality of electrode fingers of the first IDT electrode in a plan view; and at least one second mass-adding film located in at least one of the third edge area and the fourth edge area, and overlapping the plurality of electrode fingers of the second IDT electrode in a plan view; wherein a thickness of the plurality of electrode fingers of the second IDT electrode is smaller than a thickness of the plurality of electrode fingers of the first IDT electrode;

a thickness of the at least one first mass-adding film is equal to a thickness of the at least one second mass-adding film; and a width of the plurality of electrode fingers of the second IDT electrode at a portion overlapping the at least one second mass-adding film in a plan view is smaller than a width of the plurality of electrode fingers of the second IDT electrode in the second center area.

2. The acoustic wave device according to claim 1, further comprising:

a first filter device including the first acoustic wave resonator;

a second filter device including the second acoustic wave resonator; and a common connection terminal to which the first filter device and the second filter device are connected in common.

3. The acoustic wave device according to claim 2, wherein the first filter device and the second filter device are band-pass filters.

4. The acoustic wave device according to claim 2, wherein each of the first filter device and the second filter device is a transmission filter or a reception filter.

5. The acoustic wave device according to claim 2, wherein the first filter device and the second filter device are connected to differential signal potentials.

6. The acoustic wave device according to claim 1, wherein the at least one first mass-adding film includes a plurality of first mass-adding films located in at least one of the first edge area and the second edge area, and one of the plurality of first mass-adding films overlaps one of the plurality of electrode fingers of the first IDT electrode in a plan view; and the at least one second mass-adding film includes a plurality of second mass-adding films located in at least one of the third edge area and the fourth edge area, and one of the plurality of second mass-adding films overlaps one of the plurality of electrode fingers of the second IDT electrode in a plan view.

7. The acoustic wave device according to claim 6, wherein each of the plurality of first mass-adding films and the plurality of second mass-adding films includes dielectric.

8. The acoustic wave device according to claim 1, wherein a width of the plurality of electrode fingers of the first IDT electrode at a portion overlapping the at least one first mass-adding film in a plan view is greater than a width of the plurality of electrode fingers of the first IDT electrode in the first center area.

9. The acoustic wave device according to claim 1, wherein, when a dimension of the at least one first mass-adding film extending in the direction in which the plurality of electrode fingers of the first IDT electrode extend is defined as a width of the at least one first mass-adding film and a dimension of the at least one second mass-adding film extending in the direction in which the plurality of electrode fingers of the second IDT electrode extend is defined as a width of the at least one second mass-adding film, the width of the at least one first mass-adding film is greater than the width of the at least one second mass-adding film.

10. The acoustic wave device according to claim 1, wherein the at least one first mass-adding film overlaps the plurality of electrode fingers of the first IDT electrode and an area between the plurality of electrode fingers in a plan view; and the at least one second mass-adding film overlaps the plurality of electrode fingers of the second IDT electrode and an area between the plurality of electrode fingers in a plan view.

11. The acoustic wave device according to claim 1, wherein the at least one first mass-adding film is located in each of the first edge area and the second edge area, and the at least one second mass-adding film is located in each of the third edge area and the fourth edge area.

12. The acoustic wave device according to claim 1, wherein a resonant frequency of the second acoustic wave resonator is higher than a resonant frequency of the first acoustic wave resonator.

13. The acoustic wave device according to claim 1, further comprising:

a first filter device including the first acoustic wave resonator; and a second filter device including the second acoustic wave resonator; wherein the first filter device and the second filter device are connected to different signal potentials.

14. The acoustic wave device according to claim 1, wherein the acoustic wave device is a multiplexer.

15. The acoustic wave device according to claim 1, wherein the acoustic wave device is a duplexer.

16. The acoustic wave device according to claim 1, wherein the piezoelectric substrate is a multilayer substrate including a piezoelectric layer.

17. The acoustic wave device according to claim 1, further comprising reflectors on the piezoelectric substrate on both sides of the first IDT electrode.

18. The acoustic wave device according to claim 1, further comprising reflectors on the piezoelectric substrate on both sides of the second IDT electrode.

19. The acoustic wave device according to claim 1, further comprising a dielectric film covering the first IDT electrode, the second IDT electrode, the at least one first mass-adding film and the at least one second mass-adding film.

20. The acoustic wave device according to claim 1, wherein the acoustic wave device is structured to suppress a transverse mode.

* * * * *